US011728251B2

(12) United States Patent
Tani et al.

(10) Patent No.: US 11,728,251 B2
(45) Date of Patent: Aug. 15, 2023

(54) SEMICONDUCTOR POWER MODULE WITH TEMPERATURE SENSORS AND SHAPED TOP PLATE TO EQUALIZE CURRENT PATHS

(71) Applicant: Mitsubishi Electric Corporation, Tokyo (JP)

(72) Inventors: Masakazu Tani, Tokyo (JP); Shuichi Takahama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/021,027

(22) Filed: Sep. 15, 2020

(65) Prior Publication Data

US 2021/0125903 A1 Apr. 29, 2021

(30) Foreign Application Priority Data

Oct. 29, 2019 (JP) ................................ 2019-195737

(51) Int. Cl.
*H01L 23/495* (2006.01)
*H01L 23/00* (2006.01)

(52) U.S. Cl.
CPC .. *H01L 23/49541* (2013.01); *H01L 23/49575* (2013.01); *H01L 23/49582* (2013.01);
(Continued)

(58) Field of Classification Search
CPC ... H01L 23/49582; H01L 24/05; H01L 24/30; H01L 24/45; H01L 24/73;
(Continued)

(56) References Cited

U.S. PATENT DOCUMENTS 9,293,397 B1 * 3/2016 Yilmaz ............. H01L 23/49575
9,953,917 B1 * 4/2018 Gowda .................... H01L 25/50
(Continued)

FOREIGN PATENT DOCUMENTS

JP 2006-210586 A 8/2006
JP 2019-29457 A 2/2019
(Continued)

OTHER PUBLICATIONS

Communication dated Dec. 8, 2020, issued by the Japanese Patent Office in application No. 2019-195737.

*Primary Examiner* — Marcos D. Pizarro
*Assistant Examiner* — Tenley H Schofield
(74) *Attorney, Agent, or Firm* — Sughrue Mion, PLLC; Richard C. Turner

(57) ABSTRACT

An object of the present disclosure is to suppress variation in currents flowing through semiconductor elements and thereby to achieve size reduction of the semiconductor elements. The semiconductor power module includes electrode terminals for connecting a first electrode to a first external electric component, a second electrode joined to upper surfaces of a plurality of semiconductor elements, and a second electrode extension portion for connecting the second electrode to a second external electric component. The sum of a current path length from the electrode terminal to the semiconductor element in the first electrode and a current path length from the semiconductor element to a second electrode terminal portion in the second electrode, is set to be the same among the plurality of semiconductor elements.

21 Claims, 8 Drawing Sheets

(52) U.S. Cl.
CPC .............. *H01L 24/05* (2013.01); *H01L 24/30* (2013.01); *H01L 24/45* (2013.01); *H01L 24/73* (2013.01); *H01L 2224/30181* (2013.01)

(58) Field of Classification Search
CPC ........... H01L 2224/30181; H01L 24/40; H01L 25/162; H01L 23/481; H01L 23/49541; H01L 27/0292; H01L 23/49575; H01L 23/3121; H01L 25/165; H01L 25/105; H01L 25/072; H01L 25/18; H02M 7/5387; H02M 1/00; H02M 7/003
See application file for complete search history.

(56) References Cited

U.S. PATENT DOCUMENTS

| | | | |
|---|---|---|---|
| 10,361,147 B1* | 7/2019 | Xu | H01L 23/49575 |
| 2006/0055056 A1* | 3/2006 | Miura | H01L 23/4334 |
| | | | 257/779 |
| 2014/0035658 A1* | 2/2014 | Usui | H01L 24/34 |
| | | | 327/512 |
| 2017/0256483 A1* | 9/2017 | Matsuyama | H01L 24/48 |
| 2018/0190636 A1* | 7/2018 | Mukunoki | H01L 24/48 |
| 2019/0157194 A1* | 5/2019 | Iyama | H01L 23/49568 |
| 2019/0244888 A1* | 8/2019 | Kawashima | H01L 24/49 |
| 2020/0135702 A1 | 4/2020 | Arai et al. | |

FOREIGN PATENT DOCUMENTS

| | | | | |
|---|---|---|---|---|
| WO | 2015/128975 A1 | 9/2015 | | |
| WO | WO-2016009496 A1 * | 1/2016 | ........... | H01L 25/072 |
| WO | WO-2017169693 A1 * | 10/2017 | .............. | H02M 7/48 |

* cited by examiner

SEMICONDUCTOR POWER MODULE WITH TEMPERATURE SENSORS AND SHAPED TOP PLATE TO EQUALIZE CURRENT PATHS

BACKGROUND OF THE INVENTION

1. Field of the Invention

The present disclosure relates to a semiconductor power module.

2. Description of the Background Art

In a semiconductor power module composed of a plurality of semiconductor elements, in the case of, for example, using metal-oxide-semiconductor field-effect transistors (MOSFET) as the semiconductor elements, voltage is constantly applied between the drain and the source, and in order to control ON/OFF switching, voltage that is required is applied between the gate and the source. The drain side at the lower surface of the semiconductor element is joined to a metal electrode excellent in electric conductivity and thermal conductivity by solder or the like, and the source side at the upper surface of the semiconductor element is also joined to a metal electrode excellent in electric conductivity and thermal conductivity by solder or the like. The gate of the semiconductor element has a pad on the element upper surface, and the source of the semiconductor element also has a pad on the element upper surface. Some semiconductor elements have, in the vicinity of the pads, a temperature detection pad and a current detection pad. Signal terminals serving as interfaces between the pads and the outside are generally connected by wire bonding, and are sealed together with the electrodes and the like by resin such as epoxy or silicon resin, except for connection parts to the outside.

Patent Document 1 discloses a power module including a chip group composed of a plurality of semiconductor chips, and a chip group input terminal which receives a signal transmitted to the chip group. The chip group input terminal is provided at a position overlapping the chip group in plane view. Each of the plurality of semiconductor chips includes a switching element including a gate electrode formed on a semiconductor substrate, and an electrode terminal formed on the semiconductor substrate and electrically connected to the gate electrode. The electrode terminal is located on the chip group input terminal side with respect to the center of the semiconductor substrate in plan view, and is electrically connected to the chip group input terminal.

Patent Document 1 further discloses that connection resistances of connections by connection members between a module input terminal and the respective chip group input terminals of a plurality of chip groups can be adjusted so as to be close to each other among the four chip groups. Thus, the impedances between the module input terminal and the respective chip group input terminals of the plurality of chip groups can be adjusted so as to be close to each other, whereby disorder of the input waveforms of gate signals transmitted to the respective chip group input terminals of the plurality of chip groups can be prevented or suppressed.

Patent Document 1: WO2015/128975

In recent years, as an element substituting for a silicon (Si) insulated gate bipolar transistor (IGBT), a MOSFET using silicon carbide (SiC) having a wide bandgap has begun to be used also for an vehicle drive motor. As also described in Patent Document 1, SiC is more likely to cause crystal defect in the semiconductor substrate than Si. Therefore, if the size of the semiconductor element is increased, the probability of containing defect increases, and deterioration of manufacturing yield is generated. In order to avoid this, a plurality of semiconductor elements having comparatively small sizes are used in parallel.

In this case, it is necessary to suppress disorder of the input waveforms of gate signals due to variation in impedances between the input terminals and the gate electrodes as described in Patent Document 1. What is more important is suppression of variation in currents flowing between the drains and the sources of the semiconductor elements. Among the plurality of semiconductor elements, the junction temperature of the semiconductor element in which the most current flows becomes a constraint, and power that the power module can convert is restricted under the constraint of the temperature. In other words, when required output is already determined, it is necessary to increase the size of the semiconductor element in which the most current flows so that the junction temperature does not exceed the allowable value. This necessity increases when variation in currents cannot be suppressed. Generally, semiconductor elements having the same size are used in one power module. Therefore, a plurality of semiconductor elements having a large size are arranged, then size increase and also cost increase are generated.

In the case of adopting synchronous rectification, a parasite diode of a MOSFET may be utilized. In current conduction of the diode, there is a constraint due to the allowable current density, and it is necessary to determine the size of the semiconductor element in which the most current flows so as to satisfy the constraint. Therefore, it is important to suppress variation in currents.

SUMMARY OF THE INVENTION

The present disclosure has been made to solve the above problem, and an object of the present disclosure is to suppress variation in currents flowing through semiconductor elements, and thus to enable size reduction of the semiconductor elements, thereby to achieve size reduction and cost reduction of a semiconductor power module.

A semiconductor power module according to the present disclosure includes a first electrode, a plurality of semiconductor elements joined to an upper surface of the first electrode and connected in parallel to each other, electrode terminals for connecting the first electrode to a first external electric component, a second electrode joined to upper surfaces of the plurality of semiconductor elements, a second electrode extension portion for connecting the second electrode to a second external electric component, a signal pad mounted on each semiconductor element, and a signal terminal connected to the signal pad via a wire. And a sum of a current path length from the electrode terminal to the semiconductor element in the first electrode and a current path length from the semiconductor element to a second electrode terminal portion in the second electrode is the same among the plurality of semiconductor elements.

Another semiconductor power module according to the present disclosure includes a first semiconductor power module and a second semiconductor power module connected to each other. The first semiconductor power module includes a first electrode, a plurality of semiconductor elements joined to an upper surface of the first electrode and connected in parallel to each other, electrode terminals for connecting the first electrode to a first external electric component, a second electrode joined to upper surfaces of the plurality of semiconductor elements, a second electrode extension portion for connecting the second electrode to a second external electric component, a signal pad mounted on each semiconductor element, and a signal terminal connected to the signal pad via a wire. The second semiconductor power module includes a fifth electrode, a plurality of semiconductor elements joined to an upper surface of the fifth electrode and connected in parallel to each other, a third electrode terminal for connecting the fifth electrode to the second external electric component, and a fourth electrode joined to upper surfaces of the plurality of semiconductor elements and having two branch portions to be connected to the first external electric component. The electrode terminal of the first semiconductor power module, and the branch portions of the second semiconductor power module, are arranged adjacently so as to oppose each other. The second electrode extension portion of the first semiconductor power module and the third electrode terminal of the second semiconductor power module are connected to each other at one location.

The semiconductor power module according to the present disclosure enables suppression of variation in currents flowing through semiconductor elements. Thus, the sizes of the semiconductor elements can be reduced, and size reduction and cost reduction of the semiconductor power module can be achieved.

DESCRIPTION OF THE PREFERRED EMBODIMENTS

Embodiment 1

Figure 1:
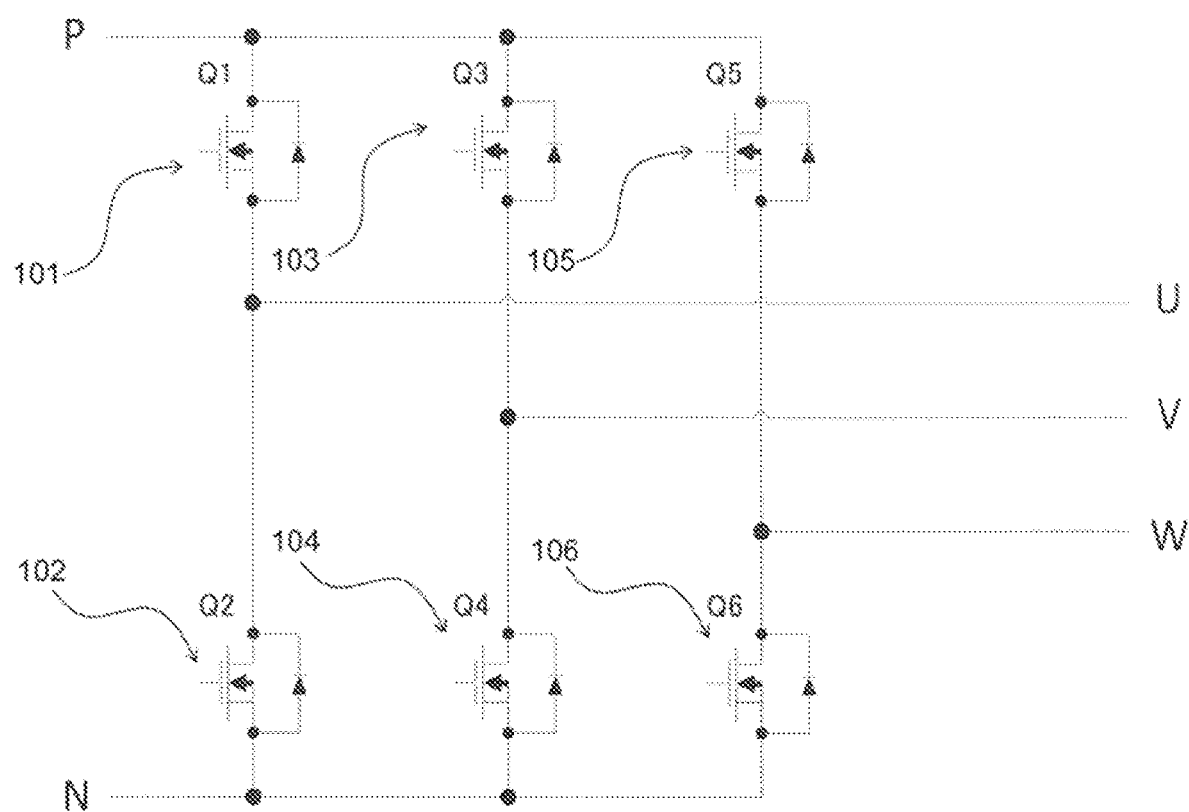
FIG. 1 is a circuit diagram showing an inverter circuit as an example of a power conversion device.

A power conversion device is a device having a switching circuit for controlling power, and examples of the power conversion device include a motor drive inverter provided in an electric vehicle, a boost converter for converting from low voltage to high voltage, and an electric power component such as a charger which is connected to external power supply equipment and charges a vehicle battery. FIG. 1 is a circuit diagram showing an inverter circuit as an example of the power conversion device. In FIG. 1, the motor drive inverter is composed of three phases, i.e., U phase, V phase, and W phase, and these phases are respectively formed by two arms of an upper arm 101 and a lower arm 102, two arms of an upper arm 103 and a lower arm 104, and two arms of an upper arm 105 and a lower arm 106.

Each arm is formed by a power module and has semiconductor elements therein. The semiconductor element is, for example, a MOSFET, an IGBT, or a diode, and as the base material thereof, a next-generation semiconductor such as silicon carbide or gallium nitride, as well as silicon, is used. As vehicles are increasingly adapted for electric driving, electric power components are required to make large outputs. Therefore, a plurality of semiconductor elements are connected in parallel so as to allow conduction of large current. In addition, in order to assure manufacturing yield of silicon carbide and gallium nitride, a configuration in which a plurality of semiconductor elements having a smaller exterior size are connected in parallel is adopted for each arm.

Figure 2:
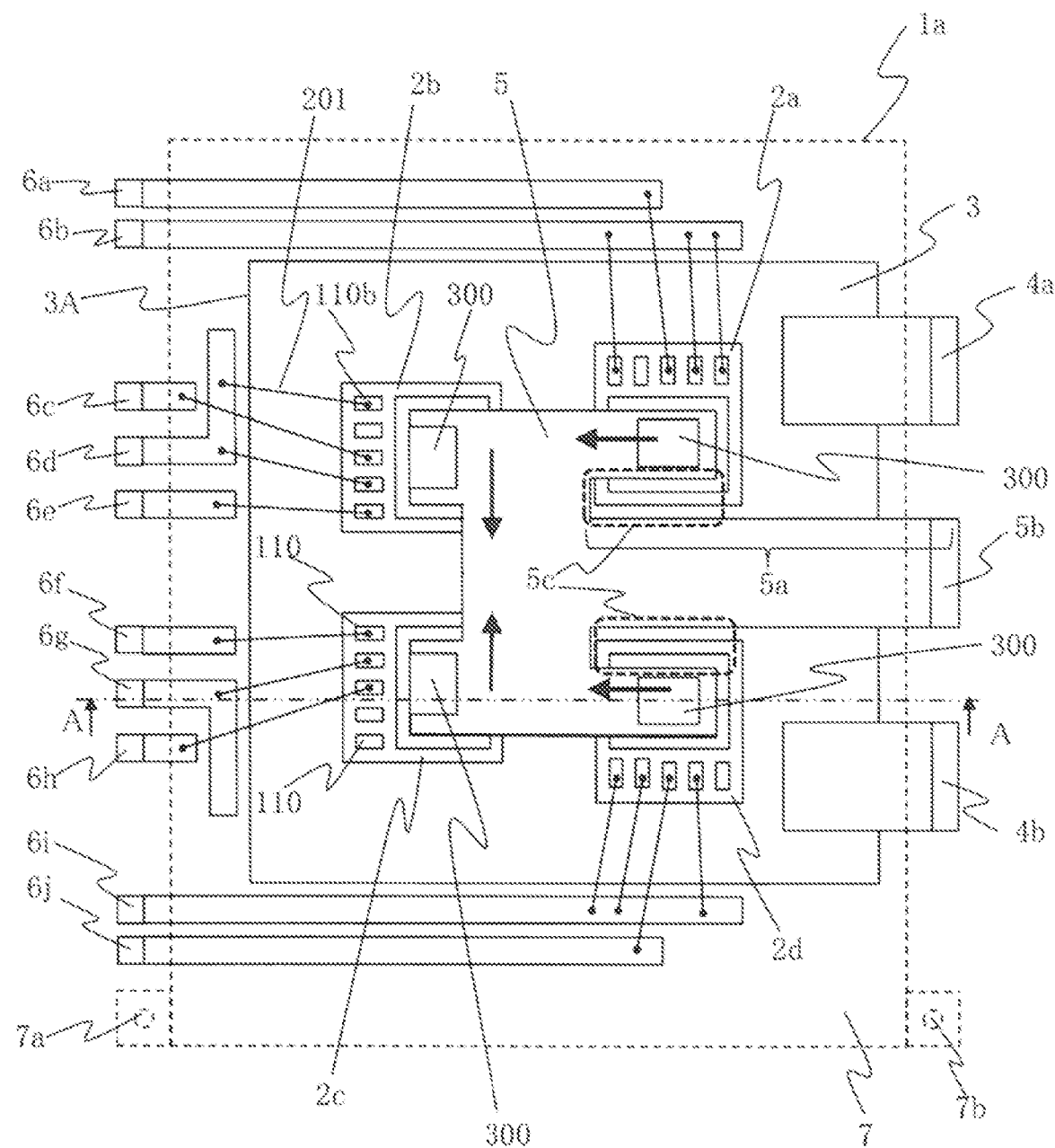
FIG. 2 is a plane view showing the structure of an upper arm in a semiconductor power module according to the first embodiment.

Next, the structure of the power module will be described. FIG. 2 is a plane view showing the structure of the upper arm in the semiconductor power module, and shows a parallel structure of four semiconductor elements composing a switching element Q1 of the upper arm 101 in FIG. 1, for example. A plurality of semiconductor elements 2a to 2d are joined to a first electrode 3 by solder or silver sinter. As the first electrode 3 having a plate shape, copper which is excellent in electric conductivity and heat dissipation property is often used. The power module generates a large amount of heat and therefore needs to be cooled. Accordingly, the first electrode 3 is joined to a cooler (not shown) made from aluminum or copper having high thermal conductivity. As the joining member, a heat-dissipation insulation adhesive sheet (not shown) or the like is used. By using a heat-dissipation insulation sheet and heat-dissipation grease, the power module may be pressed to the cooler side by a spring in order to ensure adhesion with the cooler.

The lower surfaces of the semiconductor elements 2a to 2d (here, MOSFETs) joined to the first electrode 3, i.e., the surfaces joined to the first electrode 3, are located on the drain side, and electrode terminals 4a, 4b connected to the drains are joined to the first electrode 3 by solder or the like. The upper surfaces of the semiconductor elements 2a to 2d are located on the source side, and a second electrode 5 having a plate shape is joined to sources 300 of the plurality of semiconductor elements 2a to 2d. As the joining material, solder or a liquid phase diffusion welding material is used. Here, the current paths of all the semiconductor elements 2a to 2d are formed so that currents flow from the electrode terminal 4a and the electrode terminal 4b through the drains and the sources 300 of the semiconductor elements 2a to 2d to a second electrode terminal portion 5b.

Regarding each semiconductor element 2a to 2d, the sum of the current path length from the second electrode terminal portion 5b to the source 300 of the semiconductor element 2a to 2d in the second electrode 5, and the current path length from the drain (not shown) of the semiconductor element 2a to 2d to the electrode terminal 4a, 4b in the first electrode 3, is adjusted to be equal among the semiconductor elements 2a, 2b, 2c, 2d. The adjustment is made by using the shape of the second electrode 5, and is mainly made by adjustment of the shapes and the sizes of slit portions 5c provided on both sides of a second electrode extension portion 5a. Thus, variation in currents at the time of current conduction of the parasite diodes of the MOSFETs can be suppressed.

It is desirable that the current path lengths from the second electrode terminal portion 5b to the sources 300 of the semiconductor elements 2a, 2b, 2c, 2d in the second electrode 5 are equal among the semiconductor elements 2a to 2d. However, in the above condition, these lengths cannot be perfectly equalized, and therefore these lengths are adjusted so as to be as close to each other as possible. The adjustment is made by adjusting the shapes and the sizes of the slit portions 5c. Further, the intervals between the chips are reduced (they are located near the center), so as to reduce the difference among the current path lengths in the second electrode 5. That is, the intervals between the mounting positions of the semiconductor elements 2a, 2b, 2c, 2d are reduced. It is desirable that the intervals between the mounting positions of the semiconductor elements 2a, 2b, 2c, 2d are not greater than 5 mm. Thus, variation in currents at the time of current conduction in the forward direction of the MOSFETs can be reduced.

The two electrode terminals 4a, 4b connected to the drains are located symmetrically with respect to the second electrode 5, so that there is no electric resistance difference between the semiconductor elements 2a, 2b and the semiconductor elements 2c, 2d in FIG. 2. The four semiconductor elements 2a to 2d are joined to the first electrode 3, and signal pads 110 of the semiconductor elements 2a to 2d are provided so as to oppose outer peripheral sides 3A of the first electrode 3 that are closest to the semiconductor elements 2a to 2d. For example, in FIG. 2, a signal pad 110b of the semiconductor element 2b is located at a position, in the semiconductor element 2b, that is closest to the outer peripheral side 3A of the first electrode 3. In such a configuration, the signal pads 110 of the semiconductor elements 2a to 2d are located so as to be close to signal terminals 6, so that the lengths of wires connecting the signal pads 110 and the signal terminals 6 (6a to 6j) are minimized. Thus, the electric resistance in the signal transmission path is reduced and the signal transmission speed increases, whereby control ability is improved.

The electrode terminals 4a, 4b are connected to the positive pole of the battery (first external electric component), and the second electrode terminal portion 5b is connected to a motor (second external electric component). The signal pads 110 are provided at the upper surfaces of the semiconductor elements 2a, 2b, 2c, 2d. The signal pads include gate pads and source pads for applying voltages in order to perform ON/OFF control of the semiconductor elements 2a, 2b, 2c, 2d. Further, in the present embodiment, a temperature detection pad and a current detection pad are also provided. Temperature detection is performed in the semiconductor element 2b, and current detection is performed in the semiconductor element 2c. It is noted that current detection pads in the semiconductor elements 2a, 2b, 2d at which current detection is not performed are connected to the signal terminals 6 via wires 201 so as to have the same potential as the sources 300. The signal terminals 6 are provided on one end side of the semiconductor power module, and specifically, gate signal terminals 6a, 6c, 6h, 6j, source signal terminals 6b, 6d, 6g, 6i, a temperature detection signal terminal 6e, and a current detection signal terminal 6f are provided.

The semiconductor element 2b having the temperature detection sensor and the semiconductor element 2c having the current detection sensor are located on sides opposite to each other across a center line of the second electrode 5. Detection of temperature and current is performed at the semiconductor elements 2b, 2c which are close to the wire connecting parts of the signal terminals 6a to 6j. Thus, the resistance values of the signal terminals are reduced and the signal transmission speed increases, whereby detection accuracy of temperature and current is improved.

Figure 3:
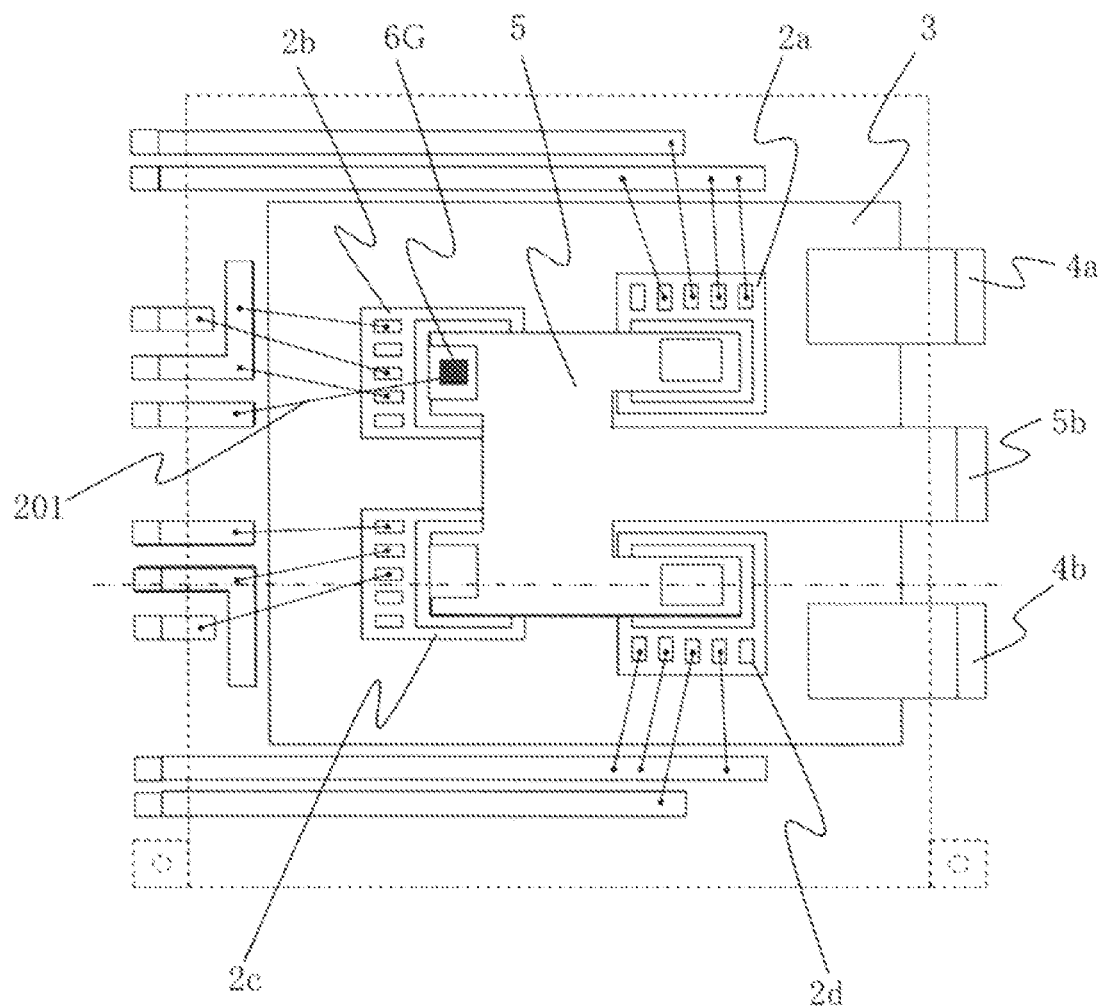
FIG. 3 is a plane view showing the structure of the semiconductor power module according to the first embodiment.
Figure 4:
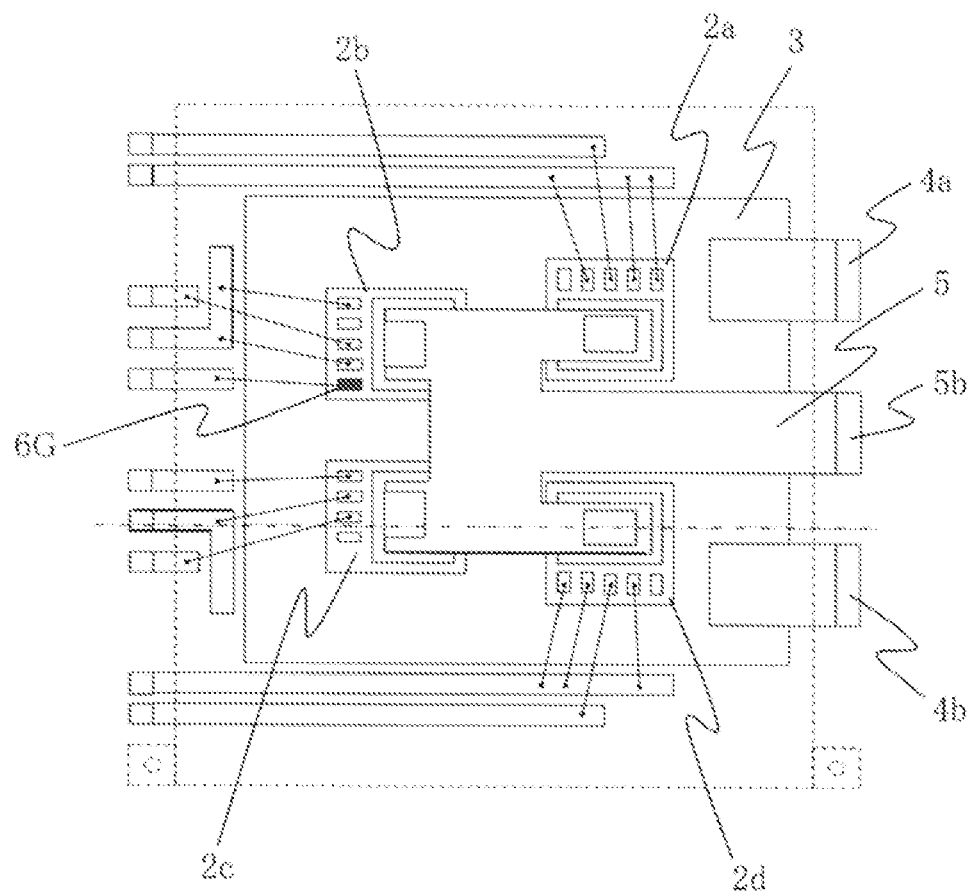
FIG. 4 is a plane view showing the structure of the semiconductor power module according to the first embodiment.

Temperature detection may be performed by providing a detection structure in the semiconductor element as described above, or may be performed by providing a thermistor near the semiconductor element. In FIG. 3, a thermistor 6G is mounted on the upper surface of the second electrode 5 by being bonded by using an adhesive agent or solder. Further, in FIG. 4, a thermistor 6G may be mounted on the upper surface of the semiconductor element 2b by being bonded by using an adhesive agent or solder.

The wires 201 connecting the signal pads 110 and the signal terminals 6 are arranged so as to be substantially perpendicular to the directions of current flowing through the second electrode 5 which are indicated by straight arrows in FIG. 2, so that the wires 201 are less influenced by a magnetic field generated by current flowing through the second electrode 5.

Since temperature detection is performed in one module, temperature detection can be performed more accurately than in the case of performing temperature detection at one location for a plurality of modules. Thus, the allowable value for the allowable junction temperature of the semiconductor element can be reduced.

Also regarding current detection, currents flowing through the respective arms are different, and therefore current detection is performed for each arm in order to perform protection against overcurrent, whereby the product quality can be maintained.

The electrode terminals 4a, 4b and the second electrode extension portion 5a are extracted in the same direction, and the signal terminals 6a to 6j connected to the signal pads 110 of the semiconductor elements 2a to 2d are extracted in the direction opposite to the above direction. In the electrode terminals 4a, 4b and the second electrode extension portion 5a, large current, e.g., several tens to several hundreds of Ampere, flows. On the other hand, in the signal terminals 6a to 6j, minute current of several mA flows. Since the signal terminals 6a to 6j are located distantly from the electrode terminals 4a, 4b and the second electrode extension portion 5a, the influence of electromagnetic noise from the electrode terminals 4a, 4b and the second electrode extension portion 5a is reduced, whereby erroneous operation can be prevented.

The signal terminals are collectively provided on the left side in FIG. 2 and so-called power-related terminals in which large currents flow are collectively provided on the right side, thereby connections with a control board (not shown) and bus bars (not shown) are respectively facilitated. Thus, the shapes of the control board and the bus bars can also be simplified, and the size can be reduced. In addition, since the signal terminals are located away from the power terminals in which large currents flow, noise contained in the signals of the signal terminals is reduced, so that temperature detection accuracy and current detection accuracy are improved, thus an effect of suppressing erroneous operation in switching operation can be obtained.

Figure 5:
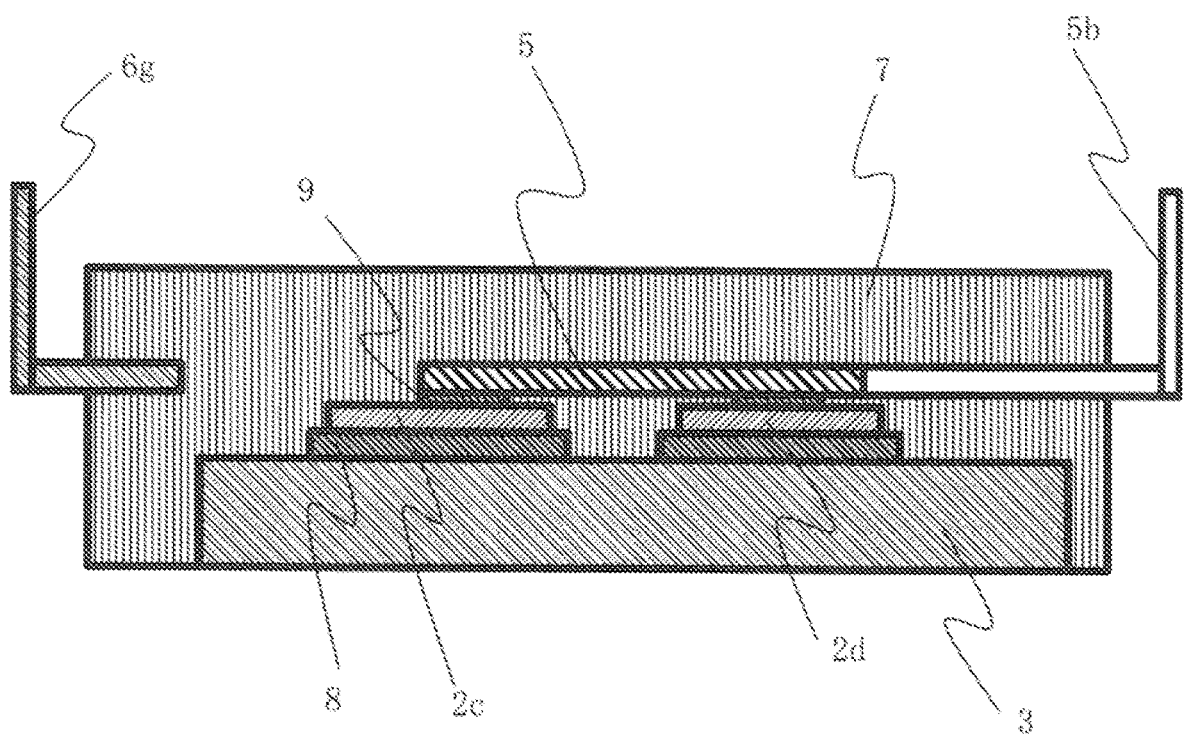
FIG. 5 is a sectional view along line A-A in FIG. 2.

FIG. 5 is a sectional view along line A-A in FIG. 2. The members described above are integrally molded by sealing resin 7. The electrode terminals 4a, 4b, the second electrode 5, and the signal terminal 6 are formed by one member called a lead frame before molding, such that the terminals are connected. After molding, cutting, i.e., so-called tie-bar cutting is performed and if necessary, a part near the terminal is bent so as to facilitate connection in a subsequent process. The component members such as the first electrode 3 are sealed by transfer molding. Using transfer molding can enhance productivity. Epoxy may be used as the sealing resin 7. The lower surface of the first electrode 3, i.e., the surface of the first electrode 3 on which the semiconductor elements 2a to 2d are not joined, serves as a heat dissipation surface, and therefore is exposed even after molding. The power module is joined to the cooler as described above, and the sealing resin 7 is provided with projections 7a, 7b for positioning with the cooler. In FIG. 5, bonding materials 8 are provided on the lower sides of the semiconductor elements 2c, 2d, and bonding materials 9 are provided on the upper sides of the semiconductor elements 2c, 2d.

In the semiconductor power module having the plurality of semiconductor elements 2a to 2d according to the present embodiment, the wire lengths from the input terminal portion of the electrode joined with the semiconductor elements 2a to 2d, to the semiconductor elements 2a to 2d, are equalized. Thus, variation in currents flowing through the semiconductor elements 2a to 2d can be suppressed. As a result, the sizes of the semiconductor elements 2a to 2d can be reduced, and size reduction and cost reduction of the semiconductor power module can be obtained.

Embodiment 2

Figure 6:
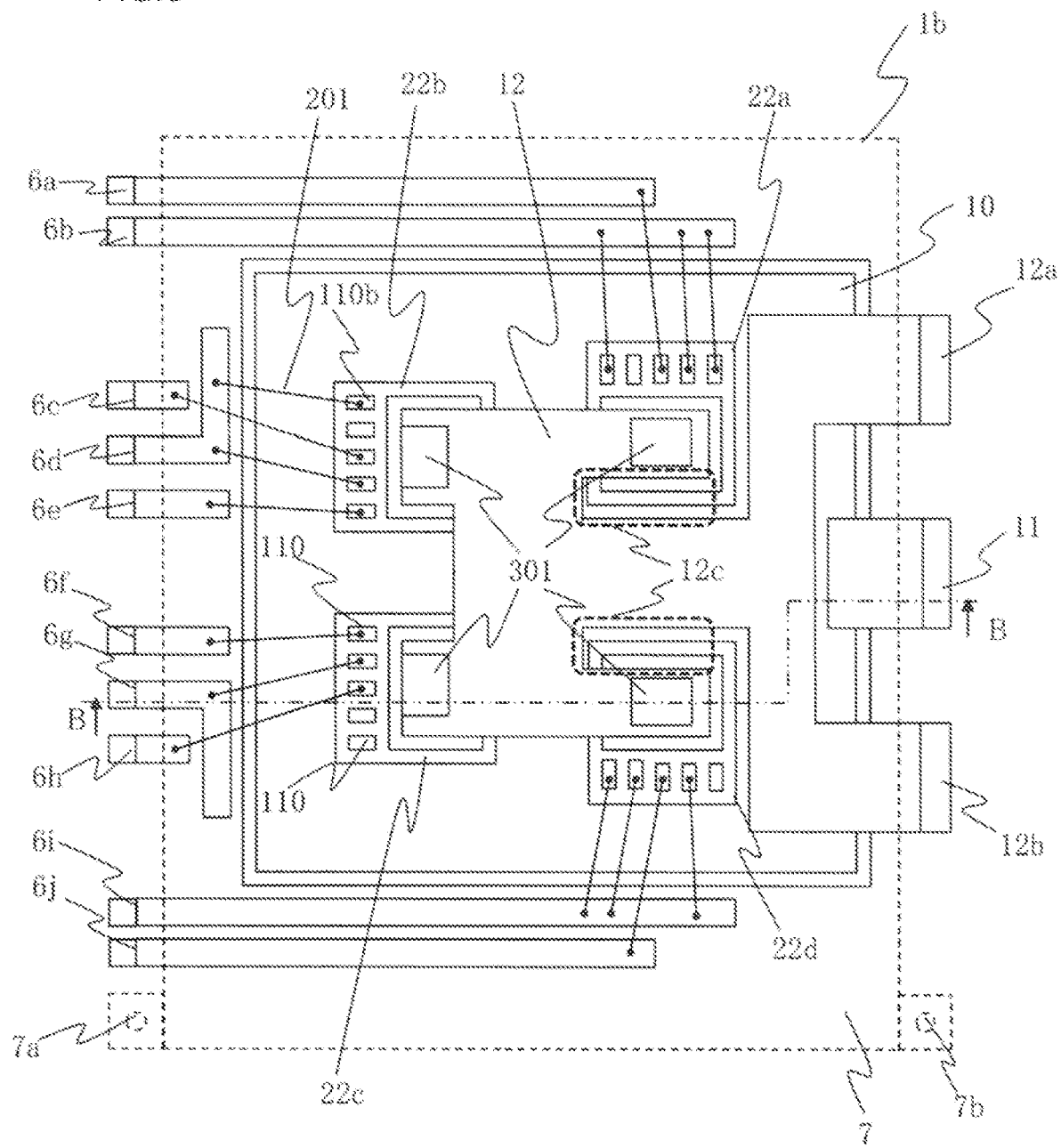
FIG. 6 is a plane view showing the structure of a lower arm in a semiconductor power module according to the second embodiment.
Figure 7:
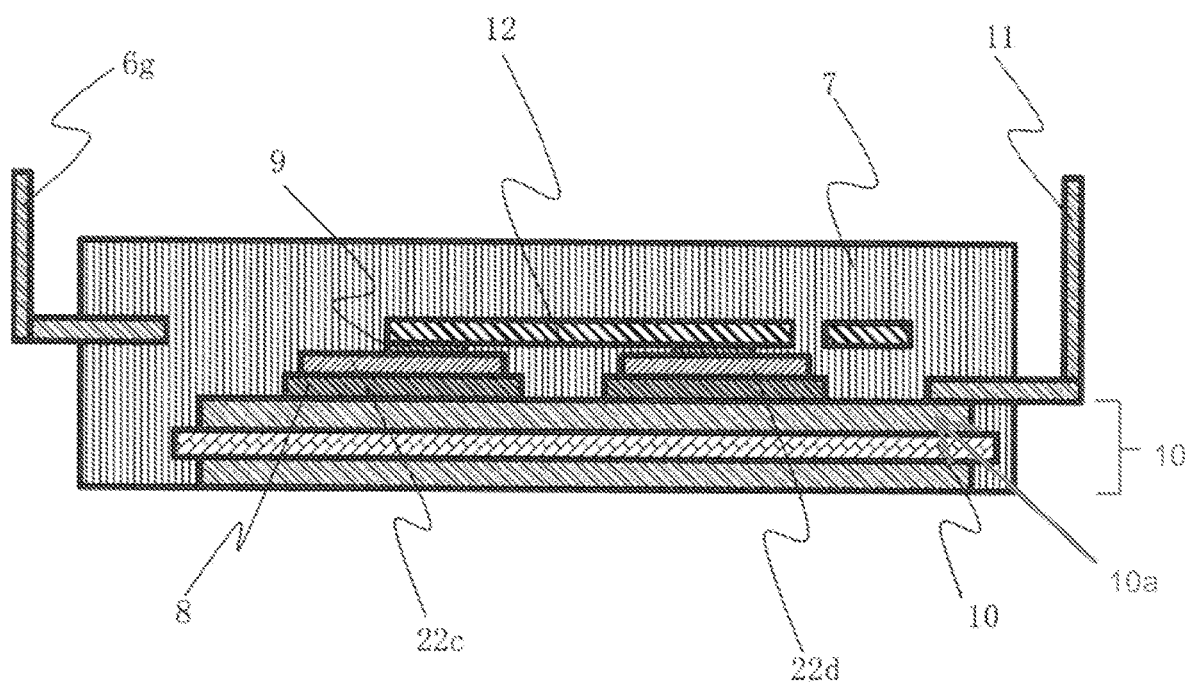
FIG. 7 is a sectional view along line B-B in FIG. 6.
Figure 8:
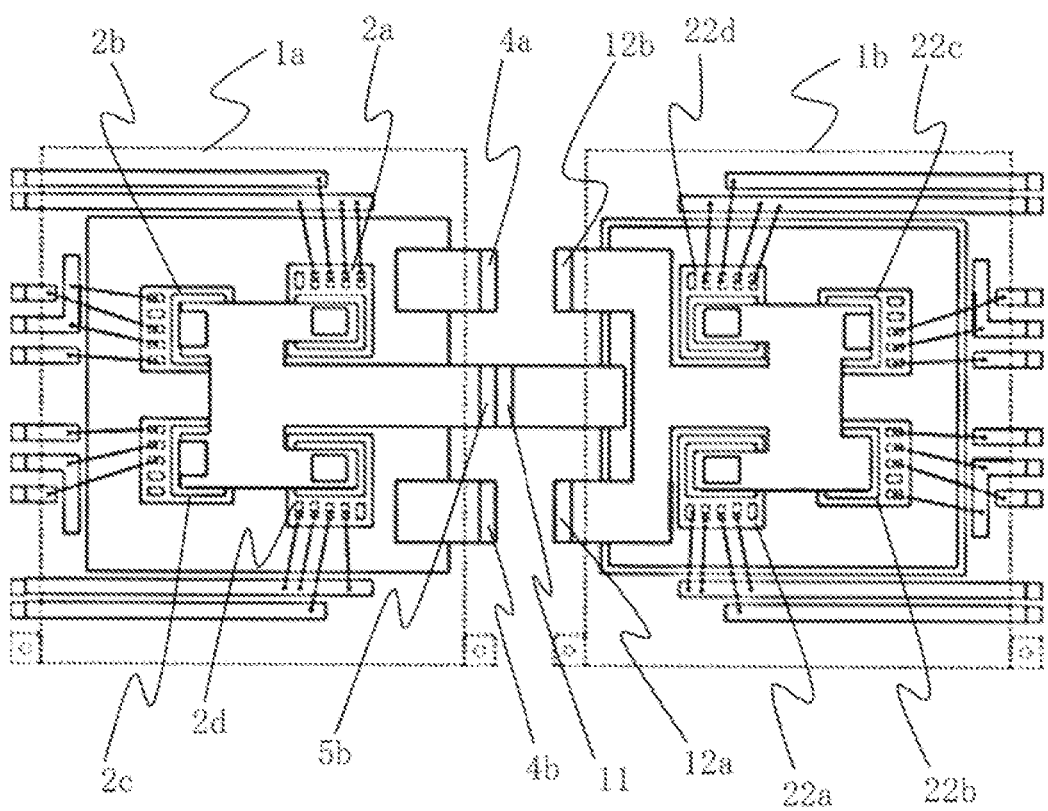
FIG. 8 is a plane view showing a state in which the semiconductor power module forming an upper arm and the semiconductor power module forming the lower arm are connected according to the second embodiment.

FIG. 6 is a plane view showing the structure of a lower arm in a semiconductor power module according to the second embodiment, and shows a parallel structure of four semiconductor elements composing a switching element Q2 of the lower arm 102 in FIG. 1, for example. FIG. 7 is a sectional view along line B-B in FIG. 6. In the structure of the lower arm 1b, an extension portion of a fourth electrode 12 connected to sources 301 of semiconductor elements 22a to 22d branches off in two parts forming branch portions 12a, 12b, and the branch portions 12a, 12b are connected to the negative electrode of the battery. A third electrode terminal 11 is connected to the upper surface of a heat-dissipation insulation substrate 10 (fifth electrode), i.e., the same surface as the surface to which the semiconductor elements 22a to 22d are joined. The third electrode terminal 11 is connected to the motor and the second electrode terminal portion 5b corresponding to the source potential of the upper arm. FIG. 8 is a plane view showing a state in which the semiconductor power module (first semiconductor power module) forming the upper arm 1a and the semiconductor power module (second semiconductor power module) forming the lower arm are connected.

In the lower arm 1b, in contrast with the upper arm 1a shown in FIG. 2, the branch portions 12a, 12b corresponding to the source potential are arranged such that the third electrode terminal 11 corresponding to the drain potential is located at the center between the branch portion 12a and the branch portion 12b, so that there is no electric resistance difference. That is, in the same manner as the first embodiment, regarding the semiconductor elements 22a to 22d, the sum of the current path length from the branch portion 12a, 12b to the source 301 of the semiconductor element 22a to 22d in the fourth electrode 12 and the current path length from the drain of the semiconductor element 22a to 22d to the third electrode terminal 11 in the fifth electrode (heat-dissipation insulation substrate 10), is adjusted to be the same among the semiconductor elements 22a to 22d so that there is no electric resistance difference.

Such adjustment is made by using the shape of the fourth electrode 12 in the same manner as the first embodiment, and is mainly made by adjustment of the shapes and the sizes of slit portions 12c disposed in the fourth electrode 12.

As shown in FIG. 8, the second electrode terminal portion 5b of the first semiconductor power module forming the upper arm 1a and the third electrode terminal 11 of the second semiconductor power module forming the lower arm 1b are connected to each other at one location, whereby the parasite inductance through circuit from the electrode terminals 4a, 4b to the branch portions 12a, 12b can be reduced. That is, the second electrode terminal portion 5b of the upper arm 1a and the third electrode terminal 11 of the lower arm 1b can be directly connected to each other without intervening a separate member, and thus the parasite inductance can be reduced.

Surge voltage is determined by a product of the parasite inductance and the switching speed, and it is necessary to adjust the switching speed so that the surge voltage does not exceed the withstand voltage of each semiconductor element. Reduction in the parasite inductance allows increase in the switching speed, whereby switching loss of the semiconductor elements can be reduced.

In the present embodiment, the electrode terminals 4a, 4b of the first semiconductor power module 1a and the branch portions 12a, 12b of the second semiconductor power module 1b are arranged adjacently so as to oppose each other. Further the second electrode extension portion 5a of the first semiconductor power module 1a and the third electrode terminal 11 of the second semiconductor power module 1b are connected to each other at one location.

In FIG. 7, in the present embodiment, the heat-dissipation insulation substrate 10 is used, instead of the first electrode 3 in the first embodiment. Normally, the heat-dissipation insulation substrate 10 has a copper-ceramic-copper layered structure (composite material), and the ceramic provides insulation between the cooler and the drains of the semiconductor elements 22a to 22d. Therefore, a conductive material such as solder or silver sinter may be used as a joining material between the power module and the cooler. It is noted that members provided under the semiconductor elements of the upper arm 1a and the lower arm 1b are desired to be the same, in view of productivity. The copper-ceramic-copper layered structure (composite material) may be adopted as the first electrode shown in the first embodiment.

A motor has been shown as a connection destination of the power module. Meanwhile, in the case of using SiC which is small in loss at the time of switching, application to high-frequency driving is also effective, and therefore the present embodiment can be effectively applied also to a boost reactor, whereby size reduction of the reactor can be achieved.

Furthermore, the number, the dimensions, the materials, and the like of the components described above may be modified appropriately.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A semiconductor power module comprising:
a first electrode;
a plurality of semiconductor elements joined to an upper surface of the first electrode and connected in parallel to each other;
electrode terminals for connecting the first electrode to a first external electric component;
a second electrode joined to upper surfaces of the plurality of semiconductor elements;
a second electrode extension portion for connecting the second electrode to a second external electric component;
a plurality of signal pads, each of the plurality of signal pads being mounted on a respective semiconductor element of the plurality of semiconductor elements;
a plurality of signal terminals; and
a plurality of wires, wherein each of the plurality of signal terminals is connected to a respective signal pad of the plurality of signal pads via a respective wire of the plurality of wires,
wherein the electrode terminals and the second electrode extension portion extend from a same side of the semiconductor power module,
wherein, for each semiconductor element of the plurality of semiconductor elements, a current path length through the semiconductor element from a nearest one of the electrode terminals to a second electrode terminal portion in the second electrode is the same as a current path length through each other semiconductor element of the plurality of semiconductor elements from the nearest one of the electrode terminals to the second electrode terminal portion,
wherein slit portions are provided on both sides of the second electrode extension portion such that for each slit portion of the slit portions, one side of the slit portion is defined in plan view by the second electrode extension portion and an opposite side of the slit portion is defined in plan view by a respective semiconductor element of the plurality of semiconductor elements.

2. The semiconductor power module according to claim 1, wherein
the slit portions provided on both sides of the second electrode extension portion have shapes and sizes adjusted such that for each semiconductor element of the plurality of semiconductor elements, the current path length through the semiconductor element from the nearest one of the electrode terminals to the second electrode terminal portion is the same as the current path length through each other semiconductor element of the plurality of semiconductor elements from the nearest one of the electrode terminals to the second electrode terminal portion.

3. The semiconductor power module according to claim 2, wherein
the electrode terminals and the second electrode extension portion are extracted in the same direction, and the signal terminal is extracted in a direction opposite to the direction in which the electrode terminals and the second electrode extension portion are extracted.

4. The semiconductor power module according to claim 1, wherein
the electrode terminals and the second electrode extension portion are extracted in the same direction, and the signal terminal is extracted in a direction opposite to the direction in which the electrode terminals and the second electrode extension portion are extracted.

5. The semiconductor power module according to claim 1, wherein
the electrode terminals comprise two members, and the two members of the electrode terminals are located symmetrically with respect to the second electrode.

6. The semiconductor power module according to claim 1, wherein
a temperature detection sensor is mounted on at least one of the semiconductor elements.

7. The semiconductor power module according to claim 1, wherein
a thermistor is mounted on an upper surface of at least one of the semiconductor elements, or an upper surface of the second electrode.

8. The semiconductor power module according to claim 1, wherein
a current detection sensor is mounted on at least one of the semiconductor elements.

9. The semiconductor power module according to claim 1, wherein
a current detection sensor is mounted on at least one of the semiconductor elements, and a temperature detection sensor is mounted on at least one of the semiconductor elements, and
the semiconductor element on which the temperature detection sensor is mounted and the semiconductor element on which the current detection sensor is mounted are located on sides opposite to each other across a center line of the second electrode.

10. The semiconductor power module according to claim 1, wherein
each wire of the plurality of wires is arranged so as to be perpendicular to a direction of current flowing through the second electrode.

11. The semiconductor power module according to claim 1, wherein
each signal pad is provided so as to oppose an outer peripheral side, of the first electrode, that is closest to the corresponding semiconductor element.

12. The semiconductor power module according to claim 1, wherein
component members of each semiconductor element are sealed by transfer molding.

13. The semiconductor power module according to claim 1, further comprising a heat-dissipation insulation substrate having a copper-ceramic-copper layered structure,
wherein the first electrode is provided as a top layer of the copper-ceramic-copper layered structure.

14. The semiconductor power module according to claim 1, wherein a first current path length from a first semiconductor element of the plurality of semiconductor elements to the second electrode terminal portion is different from a second current path length from a second semiconductor element of the plurality of semiconductor elements to the second electrode terminal portion.

15. A semiconductor power module comprising a first semiconductor power module and a second semiconductor power module connected to each other,
the first semiconductor power module includes
a first electrode,
a plurality of first semiconductor elements joined to an upper surface of the first electrode and connected in parallel to each other,
electrode terminals for connecting the first electrode to a first external electric component, a second electrode joined to upper surfaces of the plurality of first semiconductor elements, a second electrode extension portion for connecting the second electrode to a second external electric component, a signal pad mounted on each semiconductor element, and a signal terminal connected to the signal pad via a wire, the electrode terminals and the second electrode extension portion extend from a same side of the semiconductor power module, the second semiconductor power module includes a fifth electrode, a plurality of second semiconductor elements joined to an upper surface of the fifth electrode and connected in parallel to each other, a third electrode terminal for connecting the fifth electrode to the second external electric component, and a fourth electrode joined to upper surfaces of the plurality of second semiconductor elements and having two branch portions to be connected to the first external electric component, wherein the electrode terminal of the first semiconductor power module, and the branch portions of the second semiconductor power module, are arranged adjacently so as to oppose each other, wherein the second electrode extension portion of the first semiconductor power module and the third electrode terminal of the second semiconductor power module are connected to each other at one location, and wherein slit portions are provided on both sides of the second electrode extension portion such that for each slit portion of the slit portions, one side of the slit portion is defined in plan view by the second electrode extension portion and an opposite side of the slit portion is defined in plan view by a respective first semiconductor element of the plurality of first semiconductor elements.

16. The semiconductor power module according to claim 15, wherein, for each first semiconductor element of the plurality of first semiconductor elements, a first current path length through the first semiconductor element from a nearest one of the electrode terminals to a second electrode terminal portion in the second electrode is the same as a first current path length through each other first semiconductor element of the plurality of first semiconductor elements from the nearest one of the electrode terminals to the second electrode terminal portion, and wherein, for each second semiconductor element of the plurality of second semiconductor elements, a second current path length through the second semiconductor element from a nearest one of the two branch portions to the third electrode terminal is the same as a second current path length through each other second semiconductor element of the plurality of second semiconductor elements from the nearest one of the two branch portions to the third electrode terminal.

17. The semiconductor power module according to claim 16, wherein the slit portions provided on both sides of the second electrode extension portion have shapes and sizes adjusted such that for each first semiconductor element of the plurality of first semiconductor elements, the first current path length through the first semiconductor element from the nearest one of the electrode terminals to the second electrode terminal portion in the second electrode is the same as the first current path length through each other first semiconductor element of the plurality of first semiconductor elements from the nearest one of the electrode terminals to the second electrode terminal portion, and slit portions provided in the fourth electrode have shapes and sizes adjusted such that for each second semiconductor element of the plurality of second semiconductor elements, the second current path length through the second semiconductor element from the nearest one of the two branch portions to the third electrode terminal is the same as the second current path length through each other second semiconductor element of the plurality of second semiconductor elements from the nearest one of the two branch portions to the third electrode terminal.

18. The semiconductor power module according to claim 17, wherein the electrode terminals and the second electrode extension portion are extracted in the same direction, and the signal terminal is extracted in a direction opposite to the direction in which the electrode terminals and the second electrode extension portion are extracted.

19. The semiconductor power module according to claim 16, wherein the electrode terminals and the second electrode extension portion are extracted in the same direction, and the signal terminal is extracted in a direction opposite to the direction in which the electrode terminals and the second electrode extension portion are extracted.

20. The semiconductor power module according to claim 15, wherein the electrode terminals and the second electrode extension portion are extracted in the same direction, and the signal terminal is extracted in a direction opposite to the direction in which the electrode terminals and the second electrode extension portion are extracted.

21. The semiconductor power module according to claim 15, further comprising a heat-dissipation insulation substrate having a copper-ceramic-copper layered structure, wherein the fifth electrode is provided as a top layer of the copper-ceramic-copper layered structure.

* * * * *